US012755770B2

(12) United States Patent
Jeong et al.

(10) Patent No.: US 12,755,770 B2
(45) Date of Patent: Oct. 6, 2026

(54) Fe-X TEMPLATING LAYERS FOR GROWTH OF PERPENDICULARLY MAGNETIZED HEUSLER FILMS ON TOP OF A TUNNEL BARRIER

(71) Applicants: Samsung Electronics Co., Ltd., Suwon-si (KR); International Business Machines Corporation, Armonk, NY (US)

(72) Inventors: Jaewoo Jeong, Los Altos, CA (US); Ikhtiar, San Jose, CA (US); Panagiotis Charilaos Filippou, San Jose, CA (US); Chirag Garg, San Jose, CA (US); Mahesh Samant, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 463 days.

(21) Appl. No.: 18/348,087

(22) Filed: Jul. 6, 2023

(65) Prior Publication Data

US 2024/0347089 A1 Oct. 17, 2024

(30) Foreign Application Priority Data

Apr. 12, 2023 (GR) .............................. 20230100323

(51) Int. Cl.

| | |
|---|---|
| ***G11C 11/16*** | (2006.01) |
| ***H01F 10/32*** | (2006.01) |

(Continued)

(52) U.S. Cl.

CPC ........ *G11C 11/161* (2013.01); *H01F 10/3272* (2013.01); *H01F 10/3286* (2013.01);

(Continued)

(58) Field of Classification Search

CPC ............... G11C 11/161; H01F 10/3272; H01F 10/3286; H10N 50/80; H10N 50/10; H10N 50/01; H10N 50/85; H10B 61/00

(Continued)

(56) References Cited

U.S. PATENT DOCUMENTS

| | | | |
|---|---|---|---|
| 9,236,564 | B2 | 1/2016 | Carey et al. |
| 9,548,441 | B2 | 1/2017 | Oguz et al. |

(Continued)

FOREIGN PATENT DOCUMENTS

| | | | |
|---|---|---|---|
| EP | 3570283 | A1 | 11/2019 |
| WO | WO 2018/125105 | | 7/2018 |

*Primary Examiner* — Jami Valentine Miller

(74) *Attorney, Agent, or Firm* — Womble Bond Dickinson (US) LLP

(57) ABSTRACT

A magnetic random-access memory (MRAM) device includes a substrate, a bottom magnetic reference layer on the substrate, a tunnel barrier layer above the bottom magnetic reference layer, and a top magnetic free layer above the tunnel barrier layer. The top magnetic free layer includes a chemical templating layer on the tunnel barrier layer and a magnetic layer on the chemical templating layer. The chemical templating layer includes a binary alloy of $Fe_yX$ which may have a $BiF_3$ prototype structure in which y is in a range from 0.9 to 3.3, and the magnetic layer includes a Heusler compound having substantially perpendicular magnetic anisotropy.

20 Claims, 6 Drawing Sheets

(51) Int. Cl.
*H10B 61/00* (2023.01)
*H10N 50/01* (2023.01)
*H10N 50/10* (2023.01)
*H10N 50/85* (2023.01)

(52) U.S. Cl.
CPC ............. *H10B 61/00* (2023.02); *H10N 50/01* (2023.02); *H10N 50/10* (2023.02); *H10N 50/85* (2023.02)

(58) Field of Classification Search
USPC .......................................................... 257/421
See application file for complete search history.

(56) References Cited

U.S. PATENT DOCUMENTS

| | | | | |
|---|---|---|---|---|
| 10,164,172 | B2 * | 12/2018 | Hong | G11C 11/161 |
| 10,170,696 | B1 * | 1/2019 | Jeong | G11C 11/161 |
| 10,651,234 | B2 * | 5/2020 | Jeong | G11C 11/161 |
| 10,832,719 | B2 | 11/2020 | Sukegawa et al. | |
| 11,005,029 | B2 * | 5/2021 | Jeong | G11C 11/16 |
| 11,038,099 | B2 | 6/2021 | Manipatruni et al. | |
| 11,189,784 | B2 | 11/2021 | Oh et al. | |
| 11,955,153 | B1 * | 4/2024 | Dokania | G11C 11/1659 |
| 2005/0016642 | A1 * | 1/2005 | Oikawa | C22F 1/10 148/563 |
| 2005/0274439 | A1 * | 12/2005 | Gschneidner, Jr. | C01B 3/0047 420/416 |
| 2008/0239930 | A1 * | 10/2008 | Saito | H10D 48/385 257/E27.005 |
| 2010/0103565 | A1 * | 4/2010 | Lou | H01F 10/329 360/324.11 |
| 2015/0162378 | A1 * | 6/2015 | Carey | H10N 50/10 257/421 |
| 2017/0223442 | A1 * | 8/2017 | Kuwabara | H04R 1/1008 |
| 2017/0250554 | A1 * | 8/2017 | Tajima | A44C 5/0053 |
| 2017/0294574 | A1 * | 10/2017 | Hong | G11C 11/161 |
| 2018/0268887 | A1 * | 9/2018 | Endo | H10B 61/22 |
| 2018/0287037 | A1 * | 10/2018 | Maekawa | H10N 10/855 |
| 2018/0351085 | A1 * | 12/2018 | Shiokawa | G11C 11/1675 |
| 2019/0305040 | A1 * | 10/2019 | Jeong | H10B 61/00 |
| 2020/0105999 | A1 * | 4/2020 | Jeong | H10N 50/01 |
| 2020/0185598 | A1 * | 6/2020 | Noh | H10N 52/00 |
| 2020/0357985 | A1 * | 11/2020 | Sukegawa | H10B 61/00 |
| 2021/0167280 | A1 * | 6/2021 | Filippou | H10N 50/01 |
| 2022/0223783 | A1 * | 7/2022 | Jeong | H10B 61/00 |
| 2022/0262555 | A1 * | 8/2022 | Jeong | H01F 10/1936 |
| 2022/0271218 | A1 * | 8/2022 | Wang | G11C 11/1673 |
| 2023/0116592 | A1 * | 4/2023 | Samant | H01F 10/3286 257/213 |
| 2023/0273240 | A1 * | 8/2023 | Fecher | C22C 9/00 |
| 2023/0317129 | A1 * | 10/2023 | Faleev | H10N 50/85 365/158 |
| 2023/0320231 | A1 * | 10/2023 | Faleev | H01F 10/1936 257/421 |
| 2023/0336006 | A1 * | 10/2023 | Kobayashi | H02J 7/0014 |
| 2023/0413681 | A1 * | 12/2023 | Filippou | G11C 11/161 |
| 2024/0155950 | A1 * | 5/2024 | Filippou | H10N 50/10 |
| 2024/0244982 | A1 * | 7/2024 | Hu | H10N 50/10 |
| 2024/0306517 | A1 * | 9/2024 | Garg | H01F 10/30 |
| 2024/0347089 | A1 * | 10/2024 | Jeong | H10N 50/85 |
| 2026/0009117 | A1 * | 1/2026 | Chen | C23C 14/0036 |

* cited by examiner

Fe-X TEMPLATING LAYERS FOR GROWTH OF PERPENDICULARLY MAGNETIZED HEUSLER FILMS ON TOP OF A TUNNEL BARRIER

CROSS-REFERENCE TO RELATED APPLICATION

This application claims priority to and the benefit of Greek Patent Application No. 20230100323, filed on Apr. 12, 2023, the entire content of which is hereby incorporated by reference.

BACKGROUND

1. Field

The present disclosure relates to magnetic memory devices and methods of manufacturing the same.

2. Description of Related Art

Magnetic random-access memory (MRAM) devices store information utilizing magnetic materials as an information recording medium. One type of MRAM is a spin-transfer-torque magnetic random-access memory (STT-MRAM). STT-MRAM devices include a magnetic tunnel junction (MTJ) having a tunnel barrier layer stacked between a magnetic free layer and a magnetic pinned (or fixed) layer. To write to a STT-MRAM device, current is driven through the MTJ, which causes the magnetic moment of the free layer to be either aligned or anti-aligned with the magnetic moment of the pinned layer using spin transfer torque (STT). To read from the STT-MRAM, a read current passes through the MTJ.

In some related art STT-MRAM devices, the magnetic free layer includes a Heusler compound, which has a large perpendicular magnetic anisotropy (PMA) and a low moment due to ferrimagnetic configuration that are suitable for STT-MRAM applications. These STT-MRAM devices may include a ferromagnetic Heusler compound. The moment of the Heusler compound depends on the constituent elements. Additionally, related art STT-MRAM devices may include a CoAl, IrAl, RuAl, or PtAl chemical templating layer that promotes the ordered growth of the Heusler compound at an ultrathin thickness and at room temperature. The chemical templating layer needs to have a (001) orientation (these chemical templating layers have body-centered cubic (BCC) structure so (001) orientation is equivalent to (100) or (010) orientations), and thus related art STT-MRAM devices may include a seed layer below the chemical templating layer to promote such ordered growth of the chemical templating layer. Accordingly, these seed layers dictate that the magnetic free layer including the Heusler compound is located underneath the tunnel barrier layer. However, locating the magnetic free layer underneath the tunnel barrier layer, and thus locating the magnetic reference (pinned or fixed) layer above the tunnel barrier layer, is a severe limitation because currently developed SAF layers for use on a top reference layer are not as thermally robust as SAF layers below the tunnel barrier layer. For instance, in the related art, the top SAF layer can be annealed up to a maximum temperature of approximately 350° C. whereas bottom SAF layers can withstand temperatures of 400° C. or more. Additionally, the magnetic coercivity ($H_c$) of top SAF layers is only approximately 4 to 5 kOe, whereas the magnetic coercivity of bottom SAF layers is approximately 8 to 10 kOe.

SUMMARY

The present disclosure relates to various embodiments of a magnetic random-access memory (MRAM) device. In one embodiment, the MRAM device includes a substrate, a bottom magnetic reference layer above the substrate, a tunnel barrier layer above the bottom magnetic reference layer, and a top magnetic free layer above the tunnel barrier layer. The top magnetic free layer includes a chemical templating layer on the tunnel barrier layer and a magnetic layer on the chemical templating layer. The chemical templating layer includes a binary alloy of $Fe_yX$ having a $BiF_3$ prototype structure, and the magnetic layer includes a Heusler compound having perpendicular magnetic anisotropy.

The present disclosure also relates to various methods of manufacturing a magnetic random-access memory (MRAM) device. In one embodiment, the method includes forming a reference magnetic layer on a substrate, forming a tunnel barrier layer on the reference magnetic layer, and forming a free magnetic layer above the tunnel barrier layer. Forming the top magnetic free layer includes forming a chemical templating layer on the tunnel barrier layer and growing a magnetic layer on the chemical templating layer. The chemical templating layer includes a binary alloy of $Fe_yX$ having a $BiF_3$ prototype structure, and the chemical templating layer causes the magnetic layer to include a Heusler compound having perpendicular magnetic anisotropy.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

The present disclosure relates to various embodiments of a magnetic random-access memory (MRAM) device including a magnetic tunnel junction (MTJ) including a bottom magnetic reference layer and a top magnetic free layer including a Heusler compound. The MRAM device according to various embodiments of the present disclosure also includes a top chemical templating layer configured to enable growth of the Heusler compound. The top chemical templating layer may include a binary compound having the form $Fe_yX$, where X is aluminum, germanium, or gallium, y is in a range from 0.9 to 3.3, and the $Fe_yX$ binary compound may have a $BiF_3$ prototype structure. Utilizing the top chemical templating layer to grow the ordered Heusler compound above the tunnel barrier layer enables the magnetic reference layer and the associated synthetic antiferromagnetic (SAF) layer to be below the tunnel barrier layer. An SAF layer provided below the tunnel barrier layer can be annealed at higher temperatures (e.g., 400° C. or more) and has a higher magnetic coercivity ($H_c$) and a higher exchange field ($H_{ex}$) compared to a top SAF layer provided above the tunnel barrier layer.

Figure 1:
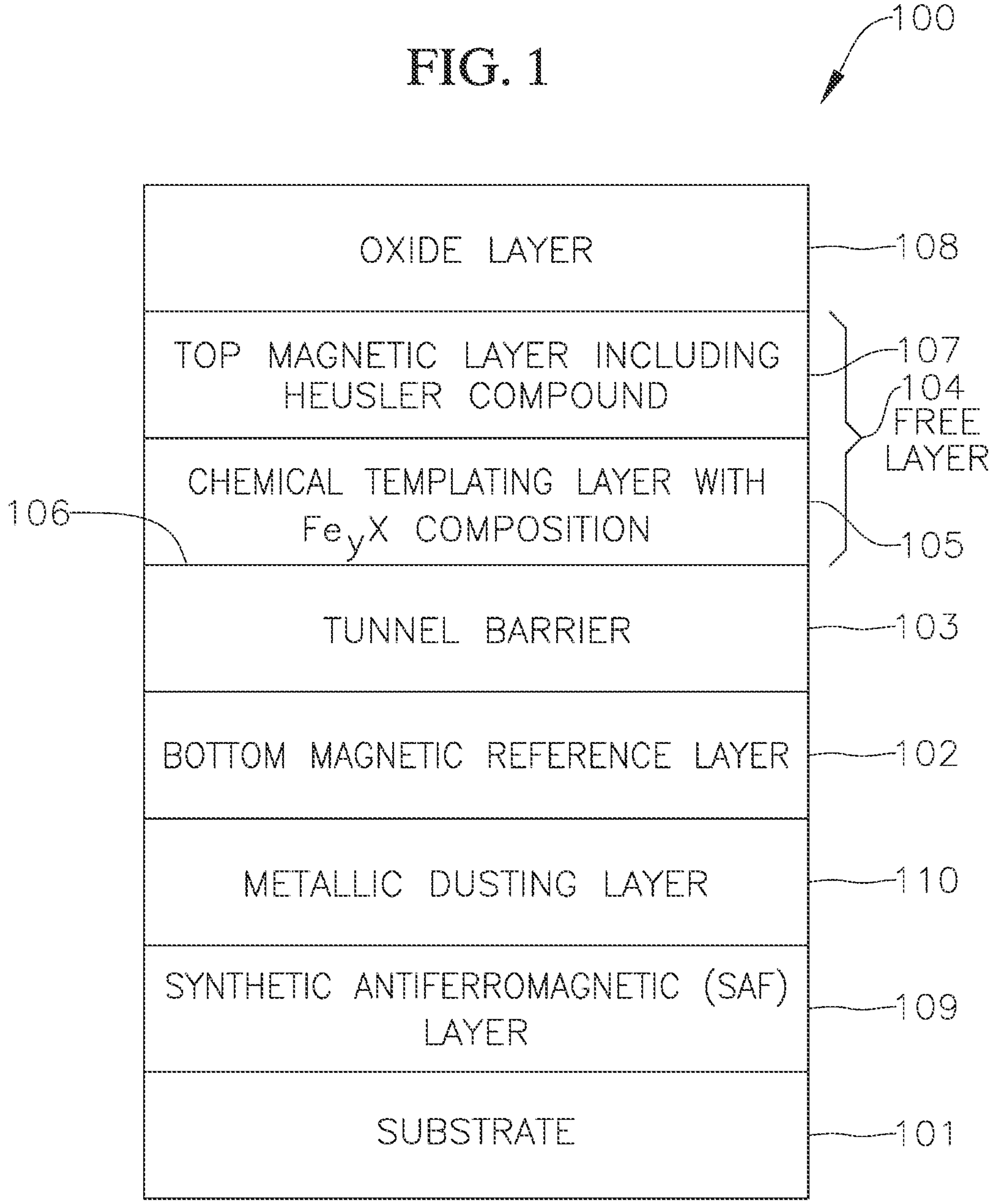
FIG. 1 is a cross-sectional view of a magnetic memory device according to one embodiment of the present disclosure including a top magnetic free layer and a top chemical templating layer including $Fe_yX$.

With reference now to FIG. 1, a magnetic random-access memory (MRAM) device 100 according to one embodiment of the present disclosure includes a substrate 101, a bottom magnetic reference layer (i.e., a pinned or fixed magnetic layer) 102 above the substrate 101, a tunnel barrier layer 103 on the bottom magnetic reference layer 102, and a top magnetic free layer 104 above the tunnel barrier layer 103. Together, the bottom magnetic reference layer 102, the tunnel barrier layer 103, and the top magnetic free layer 104 define a magnetic tunnel junction (MTJ). Additionally, in the illustrated embodiment, the bottom magnetic reference layer 102 has a fixed (or pinned) magnetization direction that is perpendicular to the tunnel barrier layer 103, and the top magnetic free layer comprising the Heusler compound 104 has a free magnetization direction (or state) that is configured to switch to be either aligned or anti-aligned with the magnetization direction of the bottom magnetic reference layer 102 using spin transfer torque (STT). In this manner, the MTJ is a bi-stable system in which the bottom magnetic reference layer 102 functions as a reference layer and the top magnetic free layer 104 functions as the bit storage layer.

Figure 2:
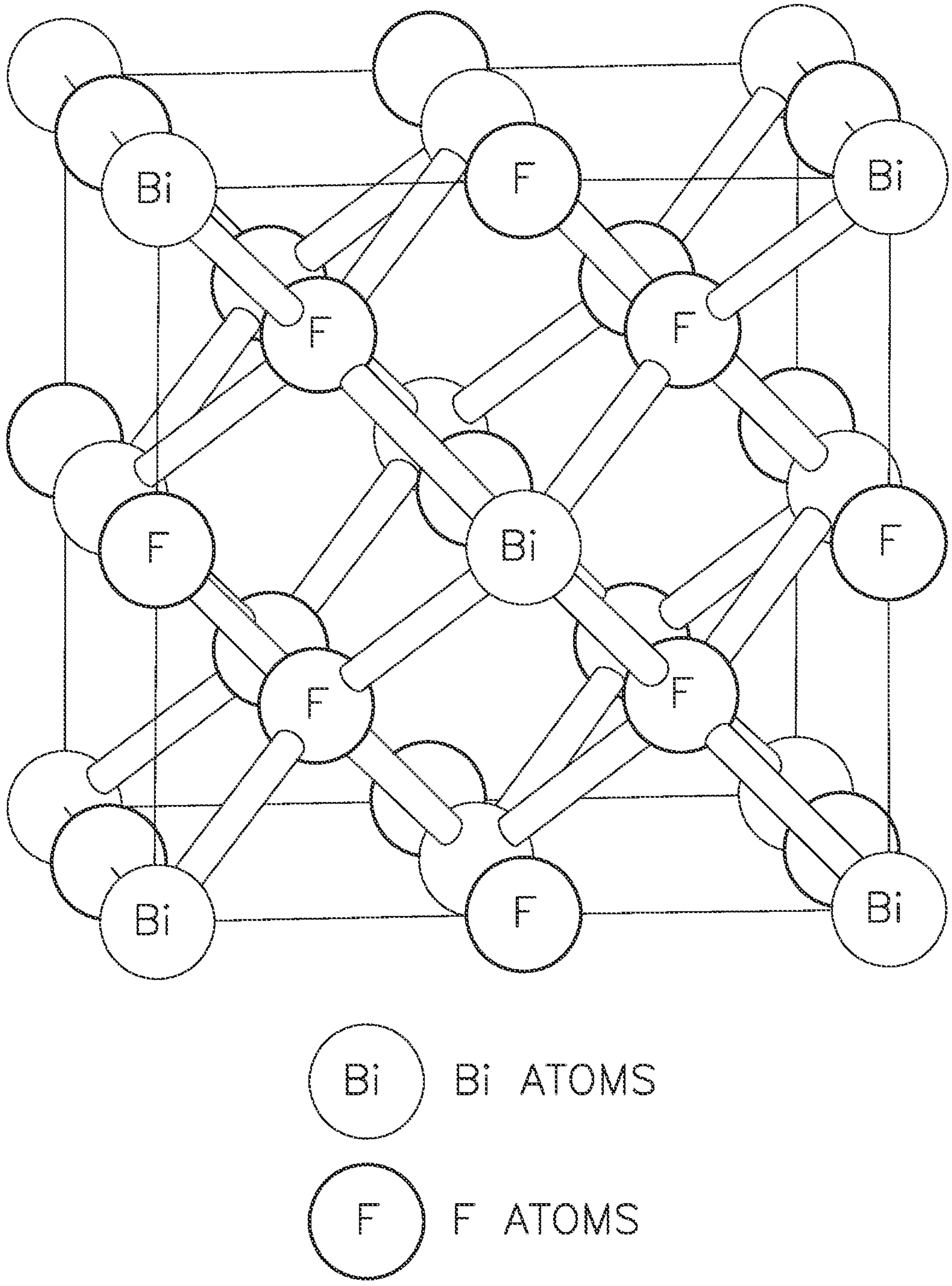
FIG. 2 depicts a $BiF_3$ prototype structure of the top chemical templating layer.

In the illustrated embodiment, the top magnetic free layer 104 includes a chemical templating layer 105 above the tunnel barrier layer 103 (e.g., directly on an upper surface 106 of the tunnel barrier layer 103), and a magnetic free layer having a Heusler compound 107 above (e.g., directly on) the chemical templating layer 105. In one or more embodiments, the Heusler compound of the magnetic free layer 107 may be $Mn_3Ge$. In one or more embodiments, the Heusler compound of the magnetic free layer 107 may be $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, or $Co_2MnSi$. The chemical templating layer 105 includes a binary alloy with the composition $Fe_yX$, where X is aluminum (Al), germanium (Ge), or gallium (Ga), and wherein y is in a range from 0.9 to 3.3. Additionally, in the illustrated embodiment, the binary alloy of the chemical templating layer 105 may have a $BiF_3$ prototype structure. As used herein, the term "$BiF_3$ prototype structure" refers to a crystal structure having a Strukturbericht designation of $D0_3$, a Pearson symbol of cF16, a face-centered cubic (FCC) Bravais Lattice, a space group of $Fm\bar{3}m$, and a space group number of 225. FIG. 2 depicts the binary alloy of the chemical templating layer 105 having a $BiF_3$ prototype structure. Table 1 below depicts a variety of suitable binary compounds (and their associated prototype structure, lattice constant, and a/Sqrt(2)) for the chemical templating layer 105 according to various embodiments of the present disclosure. As shown in Table 1 below, the binary compound of the chemical templating layer 105 may be $Fe_3Al$, $Fe_3Ge$, or $Fe_3Ga$.

TABLE 1

| Compound | Prototype Structure | Lattice Constant, a | a/Sqrt(2) | |
|---|---|---|---|---|
| $Fe_3Al$ | $BiF_3$ | 5.79 Å | 4.09 Å | Ferromagnetic |
| $Fe_3Ge$ | $BiF_3$ | 5.76 Å | 4.07 Å | Ferromagnetic |
| $Fe_3Ga$ | $BiF_3$ | 5.8 Å | 4.1 Å | Ferromagnetic |

In one or more embodiments, the tunnel barrier layer 103 comprises MgO, $MgAlO_x$, and/or AlN. In one or more embodiments, the tunnel barrier layer 103 comprises MgO, and the lattice constant of MgO is 4.20 Å. As illustrated in Table 1 above, the a/Sqrt(2) of the $Fe_yX$ compound of the chemical templating layer 105 ranges from 4.07 Å to 4.1 Å (e.g., the a/Sqrt(2) of $Fe_3Al$, $Fe_3Ge$, and $Fe_3Ga$ are 4.09 Å, 4.07 Å, and 4.1 Å, respectively). Accordingly, the lattice mismatch between the binary alloy of the chemical templating layer 105 and the MgO of the tunnel barrier layer 103 is in a range from only approximately 2% to approximately 3%. The relatively small lattice mismatch enables the $Fe_yX$ compound of the chemical templating layer 105 to grow on top of the MgO tunnel barrier layer 103. Additionally, as described in more detail below, the binary alloy with the composition $Fe_yX$ of the chemical templating layer 105 is configured to promote the growth of the Heusler compound of the magnetic free layer 107 with perpendicular magnetic anisotropy (PMA). In one or more embodiments, the tunnel barrier 103 may be formed from $MgAl_2O_4$ where the lattice spacing is tuned (engineered) by controlling the Mg—Al composition to result in better lattice matching with the $Fe_yX$ compounds (as listed above). For example, and without limitation, the composition of this tunnel barrier 103 can be represented as $Mg_{1-z}Al_{2+(2/3)z}O_4$, where $-0.5<z<0.5$.

Additionally, the binary alloy with the composition $Fe_yX$ of the chemical templating layer 105 functions as a polarization enhancement layer (PEL) due to its high spin polarization. Thus, the binary alloy having the $Fe_yX$ composition functions as both a chemical templating layer and a polarization enhancing layer. The relatively high spin polarization of the chemical templating layer 105 provides high tunneling magnetoresistance (TMR), which enables the chemical templating layer 105 to be part of the MTJ. Accordingly, unlike related art chemical templating layers that do not provide TMR and thus can only be utilized when the chemical templating layer is not adjacent to the tunnel barrier layer and the Heusler compound layer is below the tunnel barrier layer, the chemical templating layer 105 provides TMR and is adjacent to the tunnel barrier layer 103, and the chemical templating layer 105 and the magnetic free layer including the Heusler compound 107 are above the tunnel barrier layer 103.

In the illustrated embodiment, the MRAM device 100 also includes an oxide layer 108 (e.g., MgO or other suitable oxide) on an upper surface of the magnetic free layer 107. The oxide layer 108 above the magnetic free layer 107 is configured to minimize (or at least reduce) spin pumping and thereby lower the switching current and thus reduce the power consumption of the MRAM device 100.

In the illustrated embodiment, the MRAM device 100 also includes a synthetic antiferromagnetic (SAF) layer 109 above (e.g., indirectly or directly on an upper surface of) the substrate 101, and a metallic dusting layer 110 above (e.g., indirectly or directly on an upper surface of) the SAF layer 109. In one or more embodiments, an optional seed layer may be between the SAF layer 109 and the substrate 101. In one or more embodiments, the metallic dusting layer 110 may include tantalum (Ta), iridium (Ir), molybdenum (Mo), tungsten (W), cobalt/iron (Co/Fe) doped W, or Co/Fe-doped Mo. Both the SAF layer 109 and the metallic dusting layer 110 are below the tunnel barrier layer 103. In the illustrated embodiment, the bottom magnetic reference layer 102 (e.g., an alloy of Co, Fe, and B where the composition may be of the form $(CoFe)_{1-x}B_x$ where x is in a range from approximately 0.15 to approximately 0.35 ($0.15 \le x \le 0.35$), or an alloy of Co, Fe, and B where the composition may be of the form $(Co_{1-x}Fe_x)_{1-y}B_y$ where x is in a range from approximately 0.3 to approximately 0.7 ($0.3<x<0.7$) and y is in a range from approximately 0.15 to approximately 0.5 ($0.15<y<0.5$)) is in direct contact with a lower surface of the tunnel barrier layer 103 and an upper surface of the metallic dusting layer 110. Providing the SAF layer 109 below enables the SAF layer 109 to be annealed at higher temperatures and to have a higher exchange field ($H_{ex}$) compared to a top SAF layer provided above the tunnel barrier layer. For instance, in one or more embodiments, the SAF layer 109 below the tunnel barrier layer 103 may be annealed up to approximately 400° C. or more, whereas related art SAF layers above the tunnel barrier layer can be annealed up to only approximately 350° C. (i.e., the SAF layer 109 below the tunnel barrier layer 103 is more thermally robust than related art SAF layers above the tunnel barrier layer). Additionally, in one or more embodiments, the SAF layer 109 has an exchange field ($H_{ex}$) in a range from approximately 8 kOe to approximately 10 kOe, whereas related art SAF layers above the tunnel barrier layer have an exchange field of only approximately 4 kOe to approximately 5 kOe. Furthermore, in one or more embodiments, the SAF layer 109 below the tunnel barrier layer 103 has a higher magnetic coercivity ($H_c$) and compared to a top SAF layer provided above the tunnel barrier layer.

Figure 3:
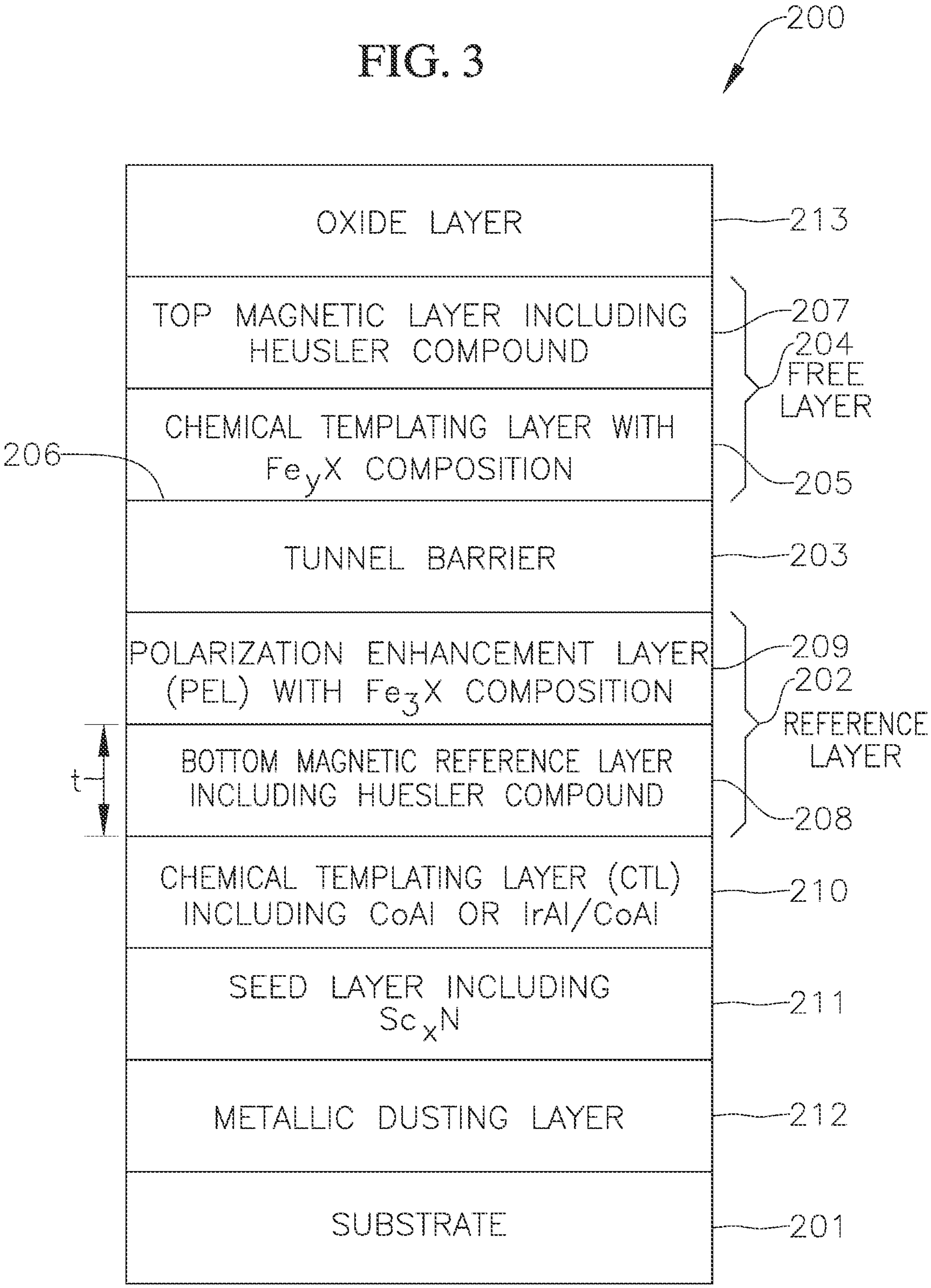
FIG. 3 is a cross-sectional view of a magnetic memory device according to another embodiment of the present disclosure including a top magnetic free layer and a top chemical templating layer including $Fe_yX$.

With reference now to FIG. 3, a magnetic random-access memory (MRAM) device 200 according to another embodiment of the present disclosure includes a substrate 201, a bottom magnetic reference layer (i.e., a pinned or fixed magnetic layer) 202 above the substrate 201, a tunnel barrier layer 203 on the bottom magnetic reference layer 202, and a top magnetic free layer 204 above the tunnel barrier layer 203. Together, the bottom magnetic reference layer 202, the tunnel barrier layer 203, and the top magnetic free layer 204 define a magnetic tunnel junction (MTJ). The bottom magnetic reference layer 202 has a fixed (or pinned) magnetization direction that is perpendicular to the tunnel barrier layer 203, and the top magnetic free layer 204 has a free magnetization direction (or state) that is configured to switch to be either aligned or anti-aligned with the magnetization direction of the bottom magnetic reference layer 202 using spin transfer torque (STT). In this manner, the MTJ is a bi-stable system in which the bottom magnetic reference layer 202 functions as a reference layer and the top magnetic free layer 204 functions as the bit storage layer.

In one or more embodiments, the top magnetic free layer 204 may be the same as the top magnetic free layer 104 described above with reference to the embodiment of the MRAM device 100 illustrated in FIG. 1. In the illustrated embodiment, the top magnetic free layer 204 includes a chemical templating layer 205 above the tunnel barrier layer 203 (e.g., directly on an upper surface 206 of the tunnel barrier layer 203), and a magnetic free layer having a Heusler compound 207 above (e.g., directly on) the chemical templating layer 205. In one or more embodiments, the Heusler compound of the magnetic free layer 207 may be $Mn_3Ge$. In one or more embodiments, the Heusler compound of the magnetic free layer 207 may be $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, or $Co_2MnSi$. The chemical templating layer 205 includes a binary alloy with the composition $Fe_yX$, where X is aluminum (Al), germanium (Ge), or gallium (Ga), and y is in a range from 0.9 to 3.3. Additionally, in the illustrated embodiment, the binary alloy of the chemical templating layer 205 may have a $BiF_3$ prototype structure, as illustrated in FIG. 2.

Figure 4:
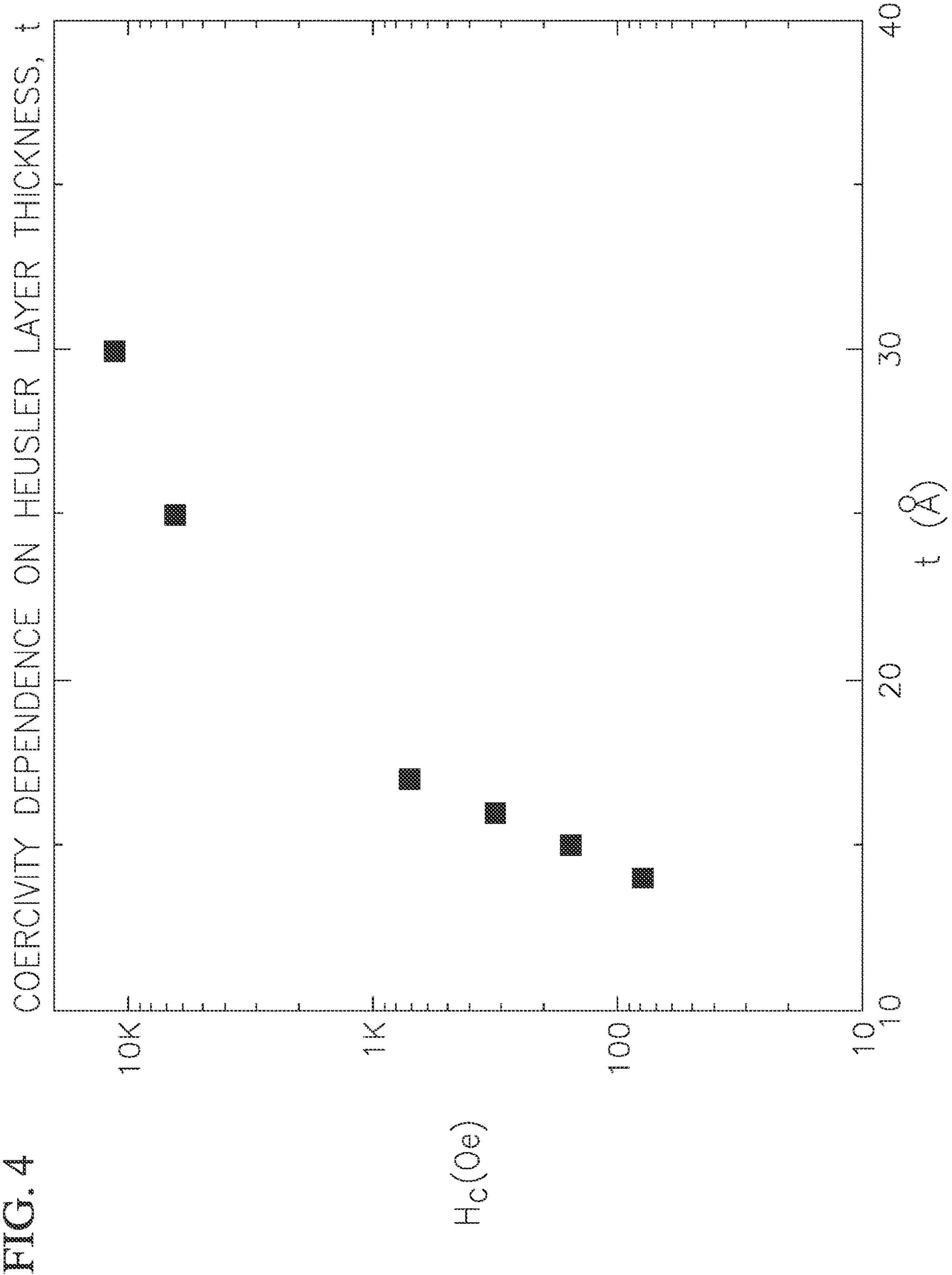
FIG. 4 is a graph depicting the coercivity dependence on the Heusler layer thickness.

Additionally, in the illustrated embodiment, the bottom magnetic reference layer 202 includes a magnetic reference layer comprising a Heusler compound 208. In one or more embodiments, the Heusler compound of the magnetic reference layer 208 may be $Mn_3Ge$. In one or more embodiments, the Heusler compound of the magnetic reference layer 208 may be $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, or $Co_2MnSi$. In one or more embodiments, the magnetic reference layer comprising the Heusler compound 208 has a thickness t such that the coercivity ($H_c$) of the magnetic reference layer 208 is greater than approximately 10 kOe (e.g., the magnetic reference layer 208 has an anisotropy field of at least approximately 10 kOe). FIG. 4 is a graph depicting the coercivity dependence on the Heusler layer thickness. As illustrated in FIG. 4, in an embodiment in which the Heusler compound of the magnetic reference layer 208 is $Mn_3Ge$, the magnetic reference layer 208 may have a thickness of at least approximately 25 Å such that the coercivity ($H_c$) of the magnetic reference layer 208 is greater than approximately 8 kOe (e.g., the magnetic reference layer 208 has an anisotropy field of at least approximately 8 kOe or at least approximately 10 kOe).

In the illustrated embodiment, the bottom magnetic reference layer 202 also includes an optional polarization enhancement layer (PEL) 209 may comprise $Fe_yX$, where X is aluminum (Al), germanium (Ge), or gallium (Ga) and y is in a range from 0.9 to 3.3 (e.g., the bottom magnetic reference layer 202 includes a stack of the magnetic reference layer 208 and the PEL 209). In the illustrated embodiment, the PEL 209 is above (e.g., directly on an upper surface of) the magnetic reference layer 208, and the PEL 209 is between the magnetic reference layer 208 and the tunnel barrier layer 203. In one or more embodiments, the PEL 209 comprising $Fe_yX$ may have relatively high spin polarization. In the illustrated embodiment in which the MRAM device 200 includes $Fe_yX$ layers symmetrically above and below the tunnel barrier layer 203 (e.g., the PEL layer 209 comprising $Fe_yX$ below the tunnel barrier layer 203 and the chemical templating layer 205 comprising $Fe_yX$ above the tunnel barrier layer 203), the MRAM device 200 may have symmetric (or substantially symmetric) spin filtering and thus enhanced tunneling magnetoresistance (TMR) compared to an otherwise MRAM device without symmetric spin filtering. In one or more embodiments, the bottom magnetic reference layer 202 may not include the PEL 209.

In the illustrated embodiment, the MRAM device 200 also includes a chemical templating layer 210 below the magnetic reference layer 208 (e.g., the magnetic reference layer 208 is directly on the chemical templating layer 210). The chemical templating layer 210 is configured to promote the growth of the Heusler compound of the magnetic reference layer 208 with substantially perpendicular magnetic anisotropy (PMA) (e.g., from approximately 80 degrees to approximately 90 degrees). In one or more embodiments, the chemical templating layer 210 may include CoAl or a bilayer of IrAl and CoAl.

In the illustrated embodiment, the MRAM device 200 also includes a seed layer 211 below the chemical templating layer 210 (e.g., the chemical templating layer 210 is directly on the seed layer 211). The seed layer 211 is configured to promote the growth of the chemical templating layer 210. In one or more embodiments, the seed layer 211 may include $Sc_xN$, where x is in a range from 0.8 to 1.2. Additionally, in one or more embodiments, the seed layer 211 may include $Sc_xN$ and chromium (Cr).

Additionally, in the illustrated embodiment, the MRAM device 200 includes a metallic dusting layer 212 comprising tantalum (Ta), molybdenum (Mo), tungsten (W), cobalt/iron (Co/Fe) doped W, Co/Fe-doped Mo, and/or CoFeB above the substrate 201. In the illustrated embodiment, the metallic dusting layer 212 is between the substrate 201 and the seed layer 211. In one or more embodiments, the metallic dusting layer 212 may be directly on an upper surface of the substrate 201.

In the illustrated embodiment, the MRAM device 200 also includes an oxide layer 213 (e.g., MgO or other suitable oxide) on an upper surface of the magnetic free layer 207. The oxide layer 213 above the magnetic free layer 207 is configured to minimize (or at least reduce) spin pumping and thereby lower the switching current and thus reduce the power consumption of the MRAM device 200.

Figure 5:
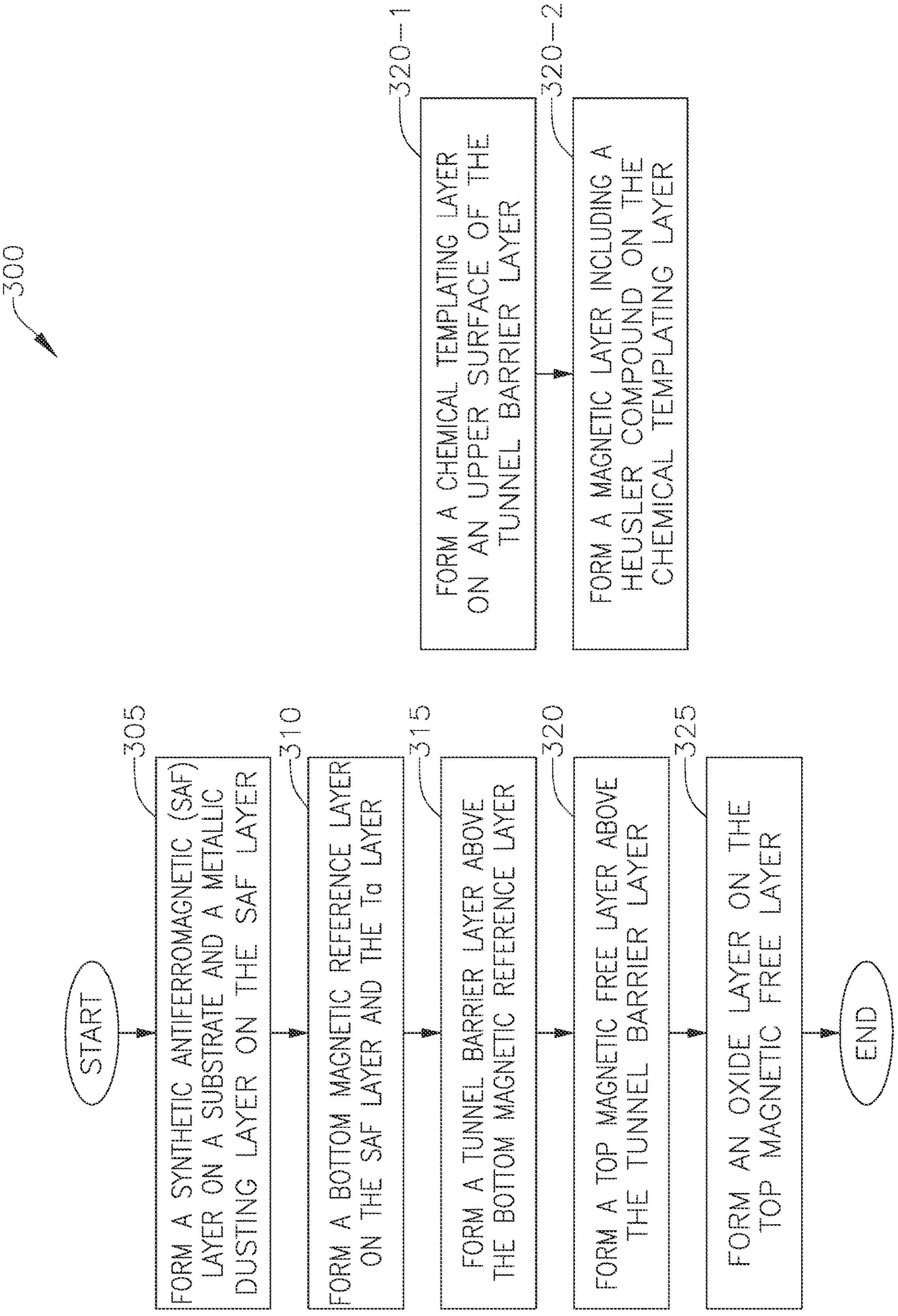
FIG. 5 is a flowchart illustrating tasks of a method of manufacturing a magnetic memory device according to one embodiment of the present disclosure.

FIG. 5 is a flowchart illustrating tasks of a method 300 of manufacturing a magnetic memory device (e.g., the MRAM device 100 illustrated in FIG. 1) according to one embodiment of the present disclosure.

In the illustrated embodiment, the method 300 includes a task 305 of forming (e.g., depositing) a synthetic antiferromagnetic (SAF) layer on a substrate, and forming (e.g., depositing) a metallic dusting layer (e.g., tantalum (Ta), iridium (Ir), molybdenum (Mo), tungsten (W), cobalt/iron (Co/Fe) doped W, or Co/Fe-doped Mo) on the SAF layer. In one or more embodiments, the task may include annealing the SAF layer. In one or more embodiments, the SAF layer may be annealed at a temperature greater than approximately 350° C., such as approximately 400° C. or more. The SAF layer, which is below a tunnel barrier layer formed in a subsequent task, is more thermally robust than related art SAF layers above the tunnel barrier layer. For instance, in one or more embodiments, the SAF layer formed in task 305 below the tunnel barrier layer may be annealed up to approximately 400° C. or more, whereas related art SAF layers above the tunnel barrier layer can be annealed up to only approximately 350° C. Additionally, in one or more embodiments, the SAF layer formed in task 305 below the tunnel barrier layer has an exchange field ($H_{ex}$) in a range from approximately 8 kOe to approximately 10 kOe, whereas related art SAF layers above the tunnel barrier layer have an exchange field of only approximately 4 kOe to approximately 5 kOe.

In the illustrated embodiment, the method 300 includes a task 310 of forming (e.g., depositing) a bottom magnetic reference layer (i.e., a pinned or fixed magnetic layer) on the SAF layer and the Ta layer formed in task 305. In one embodiment, the task 310 of forming the bottom magnetic reference layer includes depositing CoFeB (e.g., an alloy of Co, Fe, and B where the composition may be of the form $(CoFe)_{1-x}B_x$ where x is in a range from approximately 0.15 to approximately 0.35 ($0.15 \leq x \leq 0.35$), or an alloy of Co, Fe, and B where the composition may be of the form $(Co_{1-x}Fe_x)_{1-y}B_y$ where x is in a range from approximately 0.3 to approximately 0.7 ($0.3<x<0.7$) and y is in a range from approximately 0.15 to approximately 0.5 ($0.15<y<0.5$)). In one or more embodiments, the task 310 of forming the bottom magnetic reference layer comprises depositing a $Mn_3Ge$ layer and then optionally depositing a $Fe_yX$ polarization enhancement layer (PEL) (where X is aluminum (Al), germanium (Ge), or gallium (Ga) and y is in a range from 0.9 to 3.3) on the $Mn_3Ge$ layer. In one or more embodiments, the $Mn_3Ge$ layer deposited in task 310 may have a thickness of at least approximately 25 Å such that the coercivity ($H_c$) of the bottom magnetic reference layer is greater than approximately 8 kOe, as illustrated in FIG. 4.

In the illustrated embodiment, the method 300 also includes a task 315 of forming (e.g., depositing) a tunnel barrier layer above the bottom magnetic reference layer formed in task 310. In one or more embodiments, the tunnel barrier layer formed in task 315 may include MgO or $MgAl_2O_4$.

In the illustrated embodiment, the method 300 also includes a task 320 of forming (e.g., depositing) a top magnetic free layer above the tunnel barrier layer formed in task 315. In the illustrated embodiment, the task 320 of forming the top magnetic free layer includes a sub-task 320-1 of forming (e.g., growing) a chemical templating layer on (e.g., directly on) an upper surface of the tunnel barrier layer. In one or more embodiments, the chemical templating layer formed in sub-task 320-1 includes a binary alloy with the composition $Fe_yX$, where X is aluminum (Al), germanium (Ge), or gallium (Ga) and y is in a range from 0.9 to 3.3, and the binary alloy of the chemical templating layer may have a $BiF_3$ prototype structure, as illustrated in FIG. 2. Additionally, as illustrated in Table 1 above, the relatively low lattice mismatch (e.g., in a range from only approximately 2% to approximately 3% with MgO tunnel barrier) between the binary alloy of the chemical templating layer and the MgO or $MgAl_2O_4$ of the tunnel barrier layer formed in task 315 enables the $Fe_yX$ compound of the chemical templating layer to grow on top of the MgO or $MgAl_2O_4$ tunnel barrier layer in sub-task 320-1. In one or more embodiments, the sub-task 320-1 may include depositing the $Fe_yX$ layer at a cryocooled temperature to avoid a wetting issue which might otherwise occur.

In the illustrated embodiment, the task 320 of forming the top magnetic free layer also includes a sub-task 320-2 of forming (e.g., growing) a magnetic layer comprising a Heusler compound on the chemical templating layer formed in sub-task 320-1. The chemical templating layer formed in sub-task 320-1 is configured to promote the growth of the Heusler compound of the magnetic free layer formed in sub-task 320-2 with substantially perpendicular magnetic anisotropy (PMA).

In the illustrated embodiment, the method 300 also includes a task 325 of forming (e.g., depositing) an oxide layer on the top magnetic free layer formed in task 320 to complete the MRAM device. In one or more embodiments, the oxide layer formed in task 325 may include MgO or other suitable oxide. The oxide layer formed above the magnetic free layer is configured to minimize (or at least reduce) spin pumping and thereby lower the switching current and thus reduce the power consumption of the MRAM device formed according to the method 300.

Figure 6:
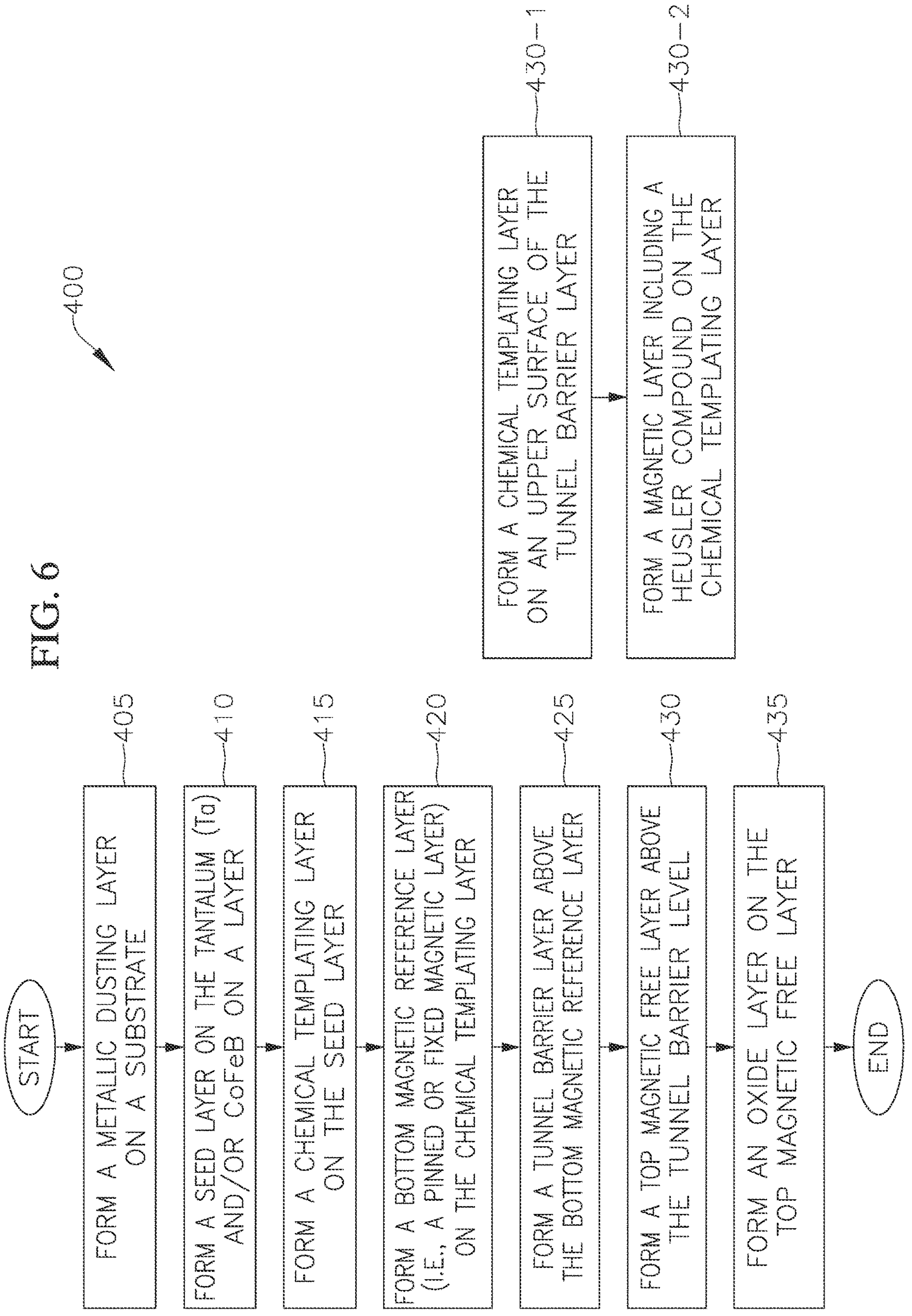
FIG. 6 is a flowchart illustrating tasks of a method of manufacturing a magnetic memory device according to another embodiment of the present disclosure.

FIG. 6 is a flowchart illustrating tasks of a method 400 of manufacturing a magnetic memory device (e.g., the MRAM device 200 illustrated in FIG. 3) according to one embodiment of the present disclosure.

In the illustrated embodiment, the method 400 includes a task 405 of forming (e.g., depositing) a metallic dusting layer including, for example, tantalum (Ta), molybdenum (Mo), tungsten (W), cobalt/iron (Co/Fe) doped W, Co/Fe-doped Mo and/or CoFeB on a substrate.

In the illustrated embodiment, the method 400 includes a task 410 of forming (e.g., depositing) a seed layer on the metallic dusting layer formed in task 405. In one or more embodiments, the seed layer formed in task 410 may include $Sc_xN$, where x is in a range from 0.8 to 1.2. Additionally, in one or more embodiments, the seed layer formed in task 410 may include $Sc_xN$ and chromium (Cr).

In the illustrated embodiment, the method 400 also includes a task 415 of forming (e.g., depositing or growing) a chemical templating layer on the seed layer formed in task 410. The seed layer formed in task 410 is configured to promote the growth of the chemical templating layer in task 415. In one or more embodiments, the chemical templating layer formed in task 415 may include CoAl or a bilayer of IrAl and CoAl.

In the illustrated embodiment, the method 400 includes a task 420 of forming (e.g., depositing) a bottom magnetic reference layer (i.e., a pinned or fixed magnetic layer) on the chemical templating layer formed in task 415. In one or more embodiments, the task 420 of forming the bottom magnetic reference layer includes a first sub-task of growing a $Mn_3Ge$ layer on the chemical templating layer, and then a second sub-task of depositing a $Fe_yX$ polarization enhancement layer (PEL) (where X is aluminum (Al), germanium (Ge), or gallium (Ga)) on the $Mn_3Ge$ layer. In one or more embodiments, the $Mn_3Ge$ layer formed in task 420 may have a thickness of at least approximately 25 Å such that the coercivity ($H_c$) of the bottom magnetic reference layer is greater than approximately 8 kOe, as illustrated in FIG. 4 (e.g., the bottom magnetic reference layer has an anisotropy field of at least approximately 8 kOe or at least approximately 10 kOe). The chemical templating layer formed in task 415 is configured to promote the $Mn_3Ge$ layer growing with substantially perpendicular magnetic anisotropy (PMA). In one or more embodiments, the task 420 may not include depositing the $Fe_yX$ PEL.

In the illustrated embodiment, the method 400 also includes a task 425 of forming (e.g., depositing) a tunnel barrier layer above the bottom magnetic reference layer formed in task 420. In one or more embodiments, the tunnel barrier layer formed in task 425 may include MgO or $MgAl_2O_4$.

In the illustrated embodiment, the method 400 also includes a task 430 of forming (e.g., depositing) a top magnetic free layer above the tunnel barrier layer formed in task 425. In the illustrated embodiment, the task 430 of forming the top magnetic free layer includes a sub-task 430-1 of forming (e.g., growing) a chemical templating layer on (e.g., directly on) an upper surface of the tunnel barrier layer. In one or more embodiments, the chemical templating layer formed in sub-task 430-1 includes a binary alloy with the composition $Fe_yX$, where X is aluminum (Al), germanium (Ge), or gallium (Ga), and the binary alloy of the chemical templating layer may have a $BiF_3$ prototype structure, as illustrated in FIG. 2. Additionally, as illustrated in Table 1 above, the relatively low lattice mismatch (e.g., in a range from only approximately 2% to approximately 3% with MgO tunnel barrier) between the binary alloy of the chemical templating layer and the MgO or $MgAl_2O_4$ of the tunnel barrier layer formed in task 425 enables the $Fe_yX$ compound of the chemical templating layer to grow on top of the MgO or $MgAl_2O_4$ tunnel barrier layer in sub-task 430-1. In one or more embodiments, the sub-task 430-1 may include depositing the $Fe_yX$ layer at a cryocooled temperature to avoid a wetting issue which might otherwise occur.

In the illustrated embodiment, the task 430 of forming the top magnetic free layer also includes a sub-task 430-2 of forming (e.g., growing) a magnetic layer comprising a Heusler compound (e.g., $Mn_3Ge$) on the chemical templating layer formed in sub-task 430-1. The chemical templating layer formed in sub-task 430-1 is configured to promote the growth of the Heusler compound of the magnetic free layer formed in sub-task 430-2 with substantially perpendicular magnetic anisotropy (PMA).

In one or more embodiments in which the method 400 includes forming (e.g., depositing or growing) $Fe_yX$ layers symmetrically above and below the tunnel barrier layer, the MRAM device formed according to method 400 may have symmetric (or substantially symmetric) spin filtering and thus enhanced tunneling magnetoresistance (TMR) compared to an otherwise MRAM device without symmetric spin filtering.

In the illustrated embodiment, the method 400 also includes a task 435 of forming (e.g., depositing) an oxide layer on the top magnetic free layer formed in task 430 to complete the MRAM device. In one or more embodiments, the oxide layer formed in task 435 may include MgO or other suitable oxide. The oxide layer formed above the magnetic free layer is configured to minimize (or at least reduce) spin pumping and thereby lower the switching current and thus reduce the power consumption of the MRAM device formed according to the method 400.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. A magnetic random-access memory (MRAM) device comprising:
- a substrate;
- a bottom magnetic reference layer above the substrate;
- a tunnel barrier layer above the bottom magnetic reference layer; and
- a top magnetic free layer above the tunnel barrier layer, the top magnetic free layer comprising:
  - a chemical templating layer on the tunnel barrier layer, the chemical templating layer comprising a binary alloy of $Fe_yX$, wherein y is in a range from 0.9 to 3.3; and
  - a magnetic layer on the chemical templating layer, the magnetic layer comprising a Heusler compound having substantially perpendicular magnetic anisotropy.

2. The MRAM device of claim 1, wherein the binary alloy of $Fe_yX$ has a $BiF_3$ prototype structure.

3. The MRAM device of claim 1, wherein X is selected from the group consisting of aluminum (Al), germanium (Ge), and gallium (Ga).

4. The MRAM device of claim 1, wherein the tunnel barrier layer comprises a material selected from the group consisting of MgO, $MgAlO_x$, and AlN.

5. The MRAM device of claim 1, further comprising an oxide layer on the magnetic layer.

6. The MRAM device of claim 1, wherein the Heusler compound is selected from the group consisting of $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, and $Co_2MnSi$.

7. The MRAM device of claim 1, wherein the Heusler compound is $Mn_3Ge$.

8. The MRAM device of claim 1, wherein the bottom magnetic reference layer comprises $(Co_{1-x}Fe_x)_{1-y}B_y$ where $0.3<x<0.7$ and $0.15<y<0.5$.

9. The MRAM device of claim 8, further comprising:

a synthetic antiferromagnetic (SAF) layer on the substrate; and a metallic dusting layer on the SAF layer, wherein the bottom magnetic reference layer comprising the $(Co_{1-x}Fe_x)_{1-y}B_y$ is on the metallic dusting layer.

10. The MRAM device of claim 1, wherein the bottom magnetic reference layer comprises a second magnetic layer comprising a Heusler compound, and wherein the second magnetic layer has an anisotropy field of at least approximately 8 kOe.

11. The MRAM device of claim 10, herein the Heusler compound of the second magnetic layer is $Mn_3Ge$, and wherein the second magnetic layer has a thickness of at least approximately 25 Å.

12. The MRAM device of claim 10, further comprising a polarization enhancement layer on the second magnetic layer, wherein the polarization enhancement layer is between the second magnetic layer and the tunnel barrier layer.

13. The MRAM device of claim 12, wherein the polarization enhancement layer comprises $Fe_yX$, wherein X is selected from the group consisting of aluminum (Al), germanium (Ge), and gallium (Ga), and wherein y is in a range from 0.9 to 3.3.

14. The MRAM device of claim 12, further comprising:

a seed layer on the substrate; and a second chemical templating layer on the seed layer, wherein the second magnetic layer is on the second chemical templating layer.

15. The MRAM device of claim 14, wherein the seed layer comprises $Sc_xN$ or $Sc_xN$ and chromium (Cr), and wherein x is in a range from 0.8 to 1.2.

16. The MRAM device of claim 14, wherein the seed layer comprises a bilayer of IrAl and CoAl.

17. A method of manufacturing a magnetic random-access memory (MRAM) device, the method comprising:

forming a bottom magnetic reference layer above a substrate;

forming a tunnel barrier layer above the bottom magnetic reference layer; and forming a top magnetic free layer above the tunnel barrier layer, forming the top magnetic free layer comprising:

forming a chemical templating layer on the tunnel barrier layer, the chemical templating layer comprising a binary alloy of $Fe_yX$, wherein y is in a range from 0.9 to 3.3; and growing a magnetic layer on the chemical templating layer, the chemical templating layer causing the magnetic layer to include a Heusler compound having substantially perpendicular magnetic anisotropy.

18. The method of claim 17, wherein the forming the bottom magnetic reference layer comprises:

forming a synthetic antiferromagnetic (SAF) layer on the substrate;

forming a metallic dusting layer on the SAF layer; and annealing the SAF layer at a temperature greater than approximately 350° C.

19. The method of claim 18, wherein the temperature is at least approximately 400° C.

20. The method of claim 17, wherein the forming the bottom magnetic reference layer comprises:

forming a seed layer on the substrate;

forming a second chemical templating layer on the seed layer; and growing a second magnetic layer on the second chemical templating layer, the second chemical templating layer causing the second magnetic layer to include a Heusler compound having substantially perpendicular magnetic anisotropy.

* * * * *